(12) United States Patent
Kim et al.

(10) Patent No.: US 11,024,683 B2
(45) Date of Patent: Jun. 1, 2021

(54) DISPLAY DEVICE INCLUDING A SENSING SIGNAL TRANSMITTER AND A SENSING SIGNAL RECEIVER

(71) Applicant: SAMSUNG DISPLAY CO., LTD., Yongin-si (KR)

(72) Inventors: Soo Ho Kim, Cheonan-si (KR); Han Na Ma, Suwon-si (KR); Youngseok Kim, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/880,190

(22) Filed: May 21, 2020

(65) Prior Publication Data

US 2020/0286968 A1  Sep. 10, 2020

Related U.S. Application Data

(63) Continuation of application No. 16/406,253, filed on May 8, 2019, now Pat. No. 10,692,944.

(30) Foreign Application Priority Data

May 16, 2018 (KR) .................. 10-2018-0055790

(51) Int. Cl.
*H01L 27/32* (2006.01)
*H01L 51/52* (2006.01)
*H01L 51/00* (2006.01)
*H01L 27/146* (2006.01)

(52) U.S. Cl.
CPC ........ *H01L 27/3244* (2013.01); *H01L 27/323* (2013.01); *H01L 27/3223* (2013.01); *H01L 27/3234* (2013.01); *H01L 51/0097* (2013.01); *H01L 51/5253* (2013.01); *H01L 27/14678* (2013.01); *H01L 2251/5338* (2013.01)

(58) Field of Classification Search
CPC ............... H01L 27/3234; H01L 27/323; H01L 27/3244; H01L 27/14678; H01L 51/0097; H01L 51/5253; H01L 2251/5338; H01L 27/3223
See application file for complete search history.

(56) References Cited

U.S. PATENT DOCUMENTS

| 9,466,653 | B2 | 10/2016 | de Jong et al. | |
| 10,692,944 | B2 * | 6/2020 | Kim | H01L 27/3223 |
| 2011/0216042 | A1 | 9/2011 | Wassvik et al. | |
| 2019/0355796 | A1 | 11/2019 | Kim et al. | |
| 2020/0097116 | A1 * | 3/2020 | Choi | G06F 3/0412 |

* cited by examiner

*Primary Examiner* — Feifei Yeung Lopez
(74) *Attorney, Agent, or Firm* — F. Chau & Associates, LLC

(57) ABSTRACT

A display device includes a display area including pixels and a non-display area adjacent to the display area. A circuit layer is disposed on the display area and the non-display area. A light emitting layer is disposed in the display area and includes a light emitting element defining the pixels. A transmitter is disposed on the circuit layer in the non-display area and transmits a sensing signal. A receiver is disposed in the display area separated from the transmitter and receives the sensing signal. A pixel control circuit for controlling the light emitting element is disposed in the circuit layer in the display area. A driving control circuit is disposed in the circuit layer in the non-display area. The driving control circuit is electrically connected to the transmitter.

11 Claims, 19 Drawing Sheets

<u>2</u>

DISPLAY DEVICE INCLUDING A SENSING SIGNAL TRANSMITTER AND A SENSING SIGNAL RECEIVER

This application is a continuation of U.S. application Ser. No. 16/406,253, filed on May 8, 2019 in the U.S. Patent and Trademark Office, which claims priority under 35 U.S.C. § 119 from, and the benefit of, Korean Patent Application No. 10-2018-0055790, filed on May 16, 2018, in the Korean Intellectual Property Office, the contents of both of which are herein incorporated by reference in their entireties.

1. Technical Field

Exemplary embodiments of the present invention relate to a display device, and more particularly, to a display device including a sensing signal transmitter and a sensing signal receiver.

2. Discussion of Related Art

A video display device such as a smart phone may include a display unit displaying an image, and a peripheral unit in which a sensing element and various driving elements are disposed. A size of the peripheral unit may be reduced to increase the size of the display unit displaying the image. Accordingly, studies have been conducted on methods of increasing the size of the display unit and reducing the size of the peripheral unit.

SUMMARY

An exemplary embodiment of the present invention provides a display device in which the size of a display unit for displaying an image is increased.

According to an exemplary embodiment of the present invention, a display device includes a substrate including a display area including pixels and a non-display area adjacent to the display area. A circuit layer is disposed on the display area and the non-display area. A light emitting layer is disposed in the display area and includes a light emitting element defining the pixels. A transmitter is disposed on the circuit layer in the non-display area and transmits a sensing signal. A receiver is disposed in the display area separated from the transmitter and receives the sensing signal. A pixel control circuit for controlling the light emitting element is disposed in the circuit layer in the display area. A driving control circuit is disposed in the circuit layer in the non-display area. The driving control circuit is electrically connected to the transmitter.

According to an exemplary embodiment of the present invention, a display device includes a substrate including a display area including pixels and a non-display area adjacent to the display area. A light emitting layer is disposed in the display area and includes a light emitting element defining the pixels. A transmitter is disposed in the non-display area and transmits a sensing signal. A receiver is disposed in the display area spaced apart from the transmitter. The receiver receives the sensing signal. The light emitting layer includes a guide opening overlapping the receiver and transmitting the sensing signal.

According to an exemplary embodiment of the present invention, a display device includes a substrate including a display area and a non-display area adjacent to the display area. A plurality of pixels are defined above the substrate. A circuit layer is disposed on the substrate. A light emitting layer is disposed on the circuit layer in the display area. A transmitter is disposed on the circuit layer in the non-display area. The transmitter is configured to transmit an infrared (IR) sensing signal to a target object. A receiver is disposed in the circuit layer. The receiver is configured to receive the IR sensing signal reflected by the target object.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE EMBODIMENTS

Figure 1:
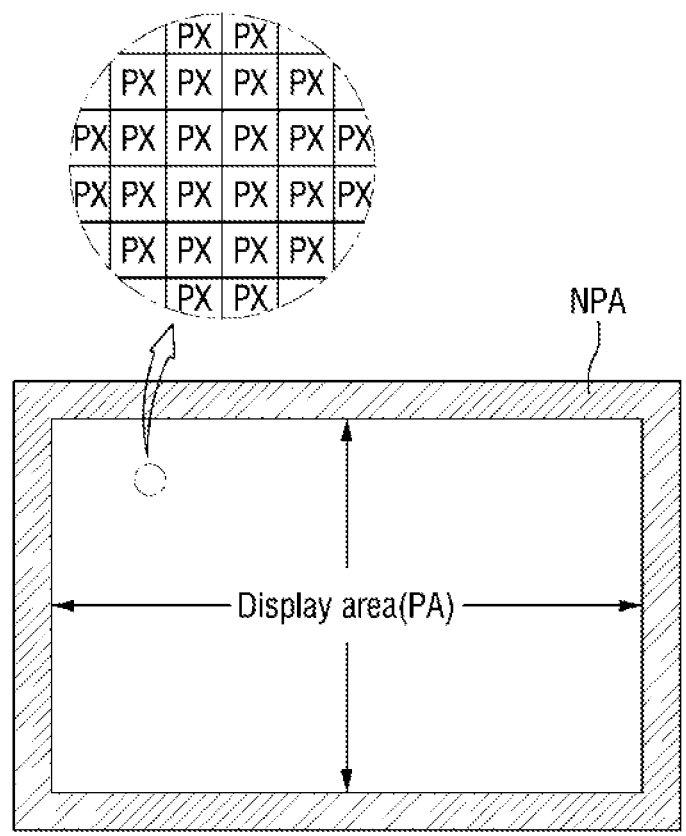
FIG. 1 is a schematic view of a display device according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein. Like reference numerals may refer to like elements throughout the specification and drawings.

As used herein, the singular forms "a", "an" and "the" may include the plural forms as well, unless the context clearly indicates otherwise.

It will be understood that when a component, such as a layer, a layer, a region, or a plate, is referred to as being "on" another component, the component may be directly on the other component or intervening components may be present.

It will be understood that although the terms "first" and "second" may be used herein to describe various components, these components should not be limited by these terms.

FIG. 1 is a schematic view of a display device according to an exemplary embodiment of the present invention.

Referring to FIG. 1, a display device 1 may include a display area PA and a non-display area NPA adjacent to the display area PA. As an example, the non-display area NPA may be arranged at four sides of the display area PA in a plan view; however, exemplary embodiments of the present invention are not limited thereto. For example, the non-display area NPA may be arranged at less than four sides (e.g., three sides) of the display area PA in a plan view.

The display area PA may include a plurality of pixels PX. As an example, the pixels PX may be spaced apart from each other or may be immediately adjacent to each other. The pixels may be arranged in a plurality of rows and columns on or above an underlying substrate. Thus, the pixels PX may be arranged in a matrix configuration. Each pixel PX may display a particular color. For example, the plurality of pixels PX may include R pixels for displaying red, G pixels for displaying green, and B pixels for displaying blue. Further, the R pixels, the G pixels, and the B pixels may be alternately arranged to implement various colors. However, exemplary embodiments of the present invention are not limited thereto, and the pixels PX may display different colors from those described above.

The display area PA may be formed, for example, in a rectangular shape. However, exemplary embodiments of the present invention are not limited thereto, and the display area PA may also have a shape such as a square, a circle, and an ellipse.

A non-display area NPA may be disposed around the display area PA. The non-display area NPA is an area where no image is displayed, and for example, a light blocking member such as a black matrix may be disposed therein. In an exemplary embodiment of the present invention, the non-display area NPA may include a bezel part of the display device 1.

In an exemplary embodiment of the present invention, the non-display area NPA may be disposed only on an outer short side of the display area PA, and in an exemplary embodiment of the present invention, the non-display area NPA may also be disposed only on an outer long side of the display area PA (e.g., in a display device having a rectangular shape). As an example, the non-display area NPA may be disposed only on one outer side of the display area PA.

In the non-display area NPA, various driving elements for driving the pixels PX may be disposed. The pixels PX may be located in the non-display area NPA, but the pixels PX located in the non-display area NPA may be dummy pixels that are not visually recognized from the outside.

Figure 2:
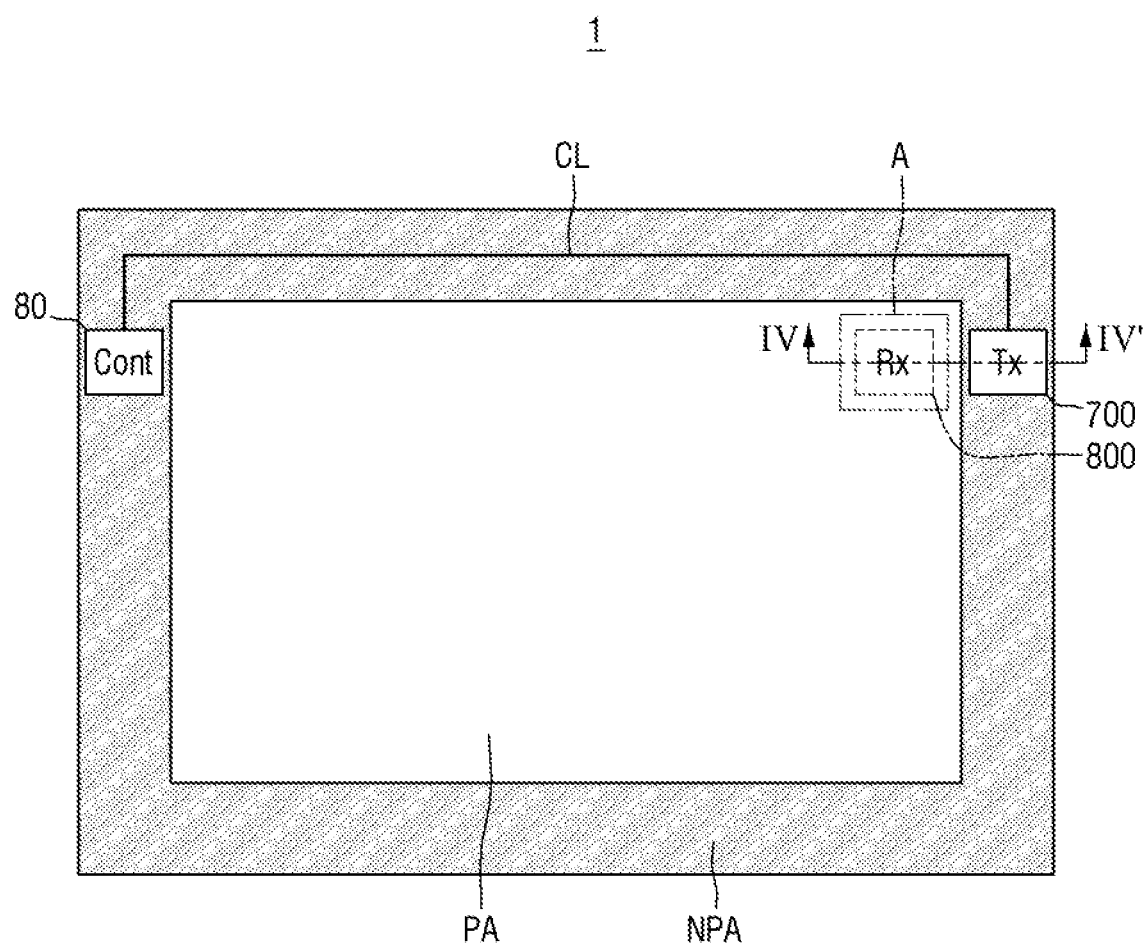
FIG. 2 is a plan view of a transmitter, a receiver, and a controller in the display device of FIG. 1.
Figure 3:
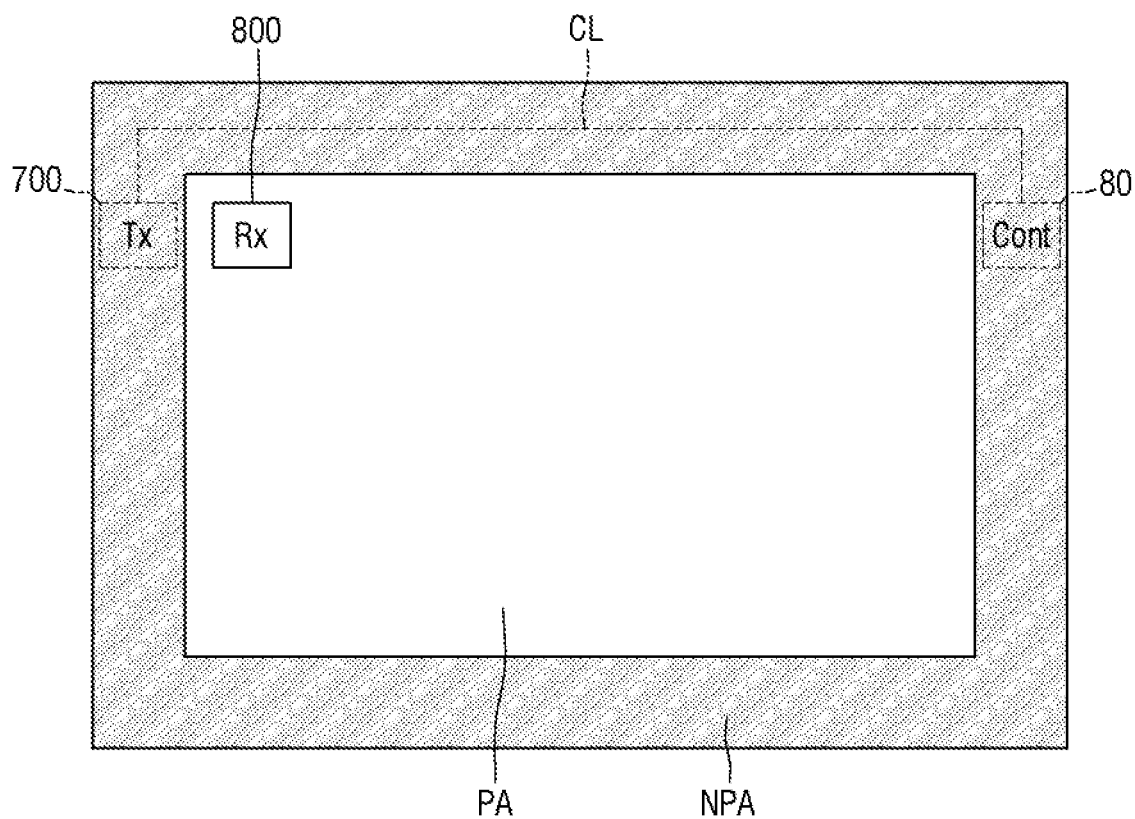
FIG. 3 is a rear view of a transmitter, a receiver, and a controller in the display device of FIG. 1.

FIG. 2 is a plan view of a transmitter, a receiver, and a controller in the display device of FIG. 1. FIG. 3 is a rear view of a transmitter, a receiver, and a controller in the display device of FIG. 1.

Referring to FIGS. 2 and 3, the display device 1 may include a transmitter 700 (Tx) transmitting a sensing signal and a receiver 800 (Rx) receiving a sensing signal transmitted from the transmitter.

The transmitter 700 may be disposed in the non-display area NPA of the display device 1. The transmitter 700 can be controlled by a controller 80 (Cont) disposed in the non-display area NPA of the display device 1. In an exemplary embodiment of the present invention, the controller 80 and the transmitter 700 may be electrically connected to each other along a connection line CL extending along the non-display area NPA. The controller 80 may also be directly connected to the transmitter 700, and thus the connection line CL may be omitted.

In an exemplary embodiment of the present invention, a part of the connection line CL electrically connecting the controller 80 and the transmitter 700 may be disposed in the display area PA. In this case, the connection line CL may use some of lines arranged in the display area PA.

Although the controller 80 and the transmitter 700 may be spaced apart from each, exemplary embodiments of the present invention are not limited thereto, and the controller 80 may be disposed immediately adjacent to the transmitter 700.

In an exemplary embodiment of the present invention, the controller 80 may include a driver IC for driving a light emitting element disposed in the display area PA. For example, the controller 80 may drive the transmitter 700 and may substantially simultaneously drive the light emitting element disposed in the display area PA.

The receiver 800 may be disposed in the display area PA of the display device 1.

The receiver 800 may be disposed on an opposite side of the display device 1 from the transmitter 700. For example, when the transmitter 700 is disposed on an upper surface of the display device 1, the receiver 800 may be disposed on a lower surface of the display device 1. As an example, the receiver 800 may be positioned adjacent to a first relatively shorter side of the display device 1 in the display area PA and the transmitter 700 may be disposed in the non-display area NPA at a second relatively shorter side of the display device 1 opposite the first relatively shorter side of the display device 1.

In an exemplary embodiment of the present invention, the receiver 800 may be disposed adjacent to the transmitter 700 (e.g., immediately adjacent to the transmitter 700), thus increasing speed and sensing efficiency of the display device 1. For example, when the transmitter 700 is disposed in a non-display area NPA of the display device 1, the receiver 800 may be disposed in an area adjacent to (e.g., immediately adjacent to) the transmitter 700 in the display area PA.

In an exemplary embodiment of the present invention, the transmitter 700 and the receiver 800 may perform infrared ray (IR) sensing. For example, the transmitter 700 may transmit an IR sensing signal, and the receiver 800 may receive an IR sensing signal transmitted from the transmitter 700 and reflected on a target object. However, exemplary embodiments of the present invention are not limited thereto, and many modifications for transmitting and receiving the sensing signal may be applied to the transmitter 700 and the receiver 800.

Figure 4:
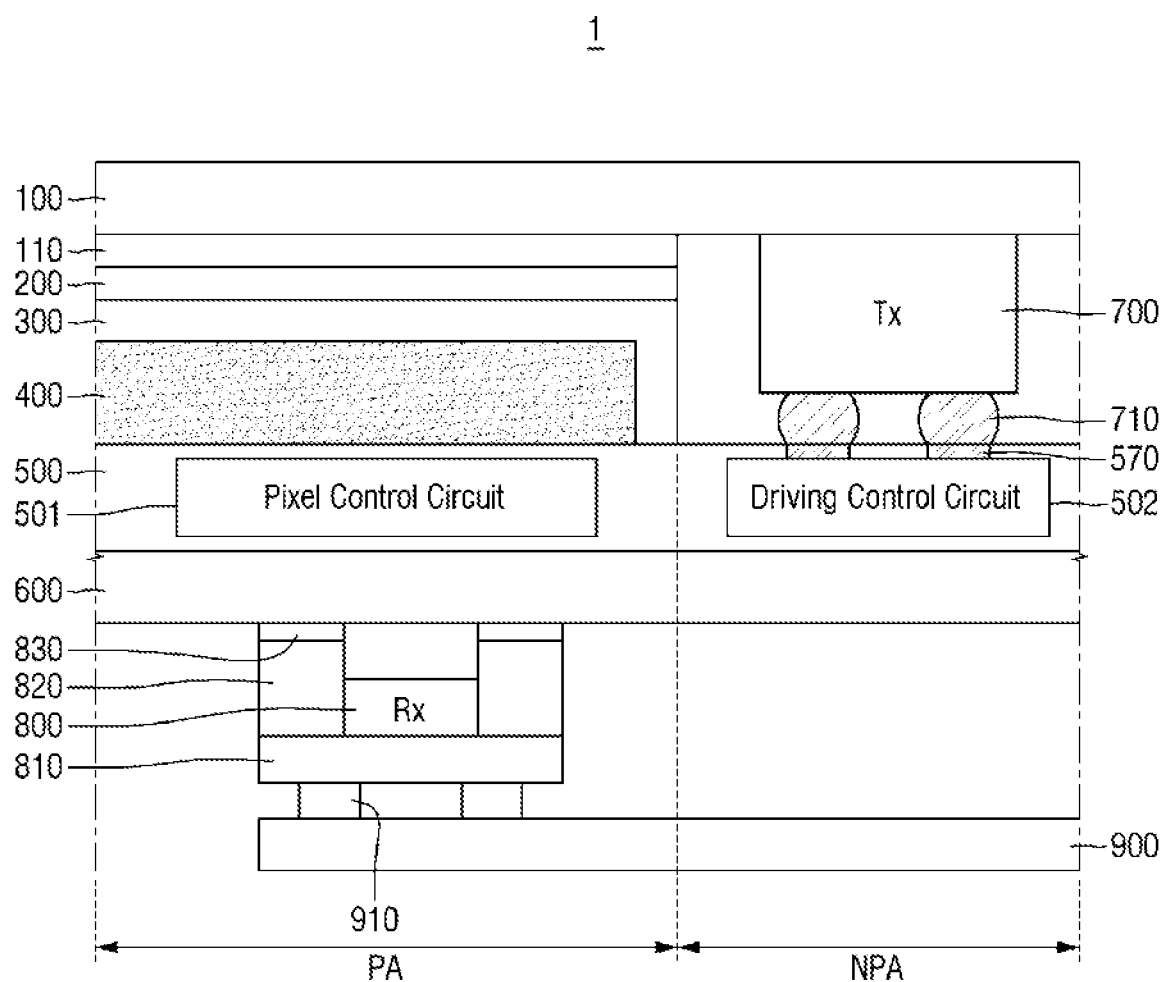
FIG. 4 is a cross-sectional view taken along line IV-IV' of FIG. 2.

FIG. 4 is a cross-sectional view taken along line IV-IV' of FIG. 2.

Referring to FIG. 4, the display device 1 may include a window 100, a light transparent bonding member 110, a touch member 200, an encapsulation layer 300, a light emitting layer 400, a circuit layer 500, and a substrate 600.

The substrate 600 may include the display area PA and the non-display area NPA. The light emitting layer 400 and the receiver 800 may be disposed in the display area PA of the substrate 600 and the transmitter 700 may be disposed in the non-display area NPA.

The substrate 600 may include a transparent material such as glass or a flexible material. Thus, the substrate 600 may be substantially transparent. An example of such a flexible material may be a plastic material. For example, the substrate 600 may include a material selected from Kapton, polyethersulfone, polycarbonate, polyimide, polyethylene terephthalate (PET), polyethylene naphthalate (PEN), polyacrylate (PAR), fiber reinforced plastic (FRP), and the like.

According to an exemplary embodiment of the present invention, the display device 1 may be a bendable or foldable display device that is in a curved or bent state at some times and is in a substantially flat state at other times. Alternatively, the display device 1 may be in a permanently folded, curved or bent state.

In an exemplary embodiment of the present invention, the substrate 600 may have a thickness of 500 μm to 200 μm. The thickness of the substrate 600 may be maintained at 200 μm or less to maintain a flexible characteristic of the substrate 600 and the thickness of the substrate 600 may be maintained at 5 μm or more to stably support the light emitting layer 400.

The circuit layer 500 may be disposed over the display area PA and the non-display area NPA. For example, the circuit layer 500 may continuously extend from the display area PA to the non-display area NPA.

The circuit layer 500 disposed in the display area PA may include a pixel control circuit 501 for controlling the light emitting element disposed in the light emitting layer 400. Examples of such a pixel control circuit 501 include a thin layer transistor, a capacitor, and various lines for electrically connecting the thin layer transistor and the capacitor to an external circuit. The pixel control circuit 501 will be described in more detail below.

In an exemplary embodiment of the present invention, the pixel control circuit 501 may be electrically connected to a controller 80 (see, e.g., FIG. 2). In this case, the controller 80 may serve as a driver IC driving the light emitting element disposed in the light emitting layer 400.

The circuit layer 500 disposed in the non-display area NPA may include a driving control circuit 502 for driving the transmitter 700. An example of such a driving control circuit may include a thin layer transistor and a line 570 for electrically connecting the thin layer transistor and the transmitter 700. In an exemplary embodiment of the present invention, such a driving control circuit 502 may also be electrically connected to the controller 80. In this case, the controller 80 may serve as a controller controlling an operation of the transmitter 700 while serving as a driver IC driving the light emitting element disposed in the light emitting layer 400.

The light emitting layer 400 may be disposed on the display area PA of the circuit layer 500. The light emitting layer 400 may include a light emitting element that defines a pixel PX (see, e.g., FIG. 1) of the display device 1. In an exemplary embodiment of the present invention, such a light emitting element may include an organic light emitting device. However, exemplary embodiments of the present invention are not limited thereto, and a type of the light emitting element that defines the pixel PX of the display device 1 may be modified, as desired. For example, when the light emitting layer 400 includes the organic light emitting device, the transmitter 700 may include an inorganic LED.

The encapsulation layer 300 may be disposed on the light emitting layer 400 of the display area PA. The encapsulation layer 300 may substantially cover the light emitting layer 400, and may protect the light emitting layer 400 from external moisture. The encapsulation layer 300 may include a single or multilayer layer including an inorganic layer or a laminated layer in which inorganic layers and organic layers are alternately laminated.

The touch member 200 may be disposed on the encapsulation layer 300 of the display area PA. The touch member 200 might only be disposed in the display area PA and might not be disposed in the non-display area NPA. The touch member 200 may acquire position information of an input point by a capacitive method, a resistive layer method, an electromagnetic induction method, or an infrared method, for example.

The window 100 may be disposed on the upper portion of the touch member 200. For example, the window 100 may be positioned on a side of the touch member 200 that is opposite the light emitting layer 400. The window 100 may substantially cover and protect the touch member 200 and components included in or below the touch member 200. The window 100 may be disposed over the display area PA and the non-display area NPA. For example, the side of the window 100 may protrude from the touch member 200 on the plane.

The window 100 may include a transparent material. Thus, the window 100 may be substantially transparent. The window 100 may include, for example, glass or plastic. When the window 100 includes plastic, the window 100 may have a flexible characteristic.

Examples of the plastic applicable to the window 100 are not limited thereto, but may include polyimide, polyacrylate, polymethylmethacrylate (PMMA), polycarbonate (PC), polyethylenenaphthalate (PEN), polyvinylidene chloride, polyvinylidene difluoride (PVDF), polystyrene, ethylene vinylalcohol copolymer, polyethersulfone (PES), polyetherimide (PEI), polyphenylene sulfide (PPS), polyallylate, triacetyl cellulose (TAC), or cellulose acetate propionate (CAP). Thus, the window 100 may be a plastic window and may include at least one of the plastic materials listed above.

When the window 100 includes plastic, the window 100 may further include coating layers disposed on the upper and lower surfaces of the plastic. In an exemplary embodiment of the present invention, the coating layer may be a hard coating layer including an organic layer and/or an organic-inorganic complex layer including an acrylate compound, for example. The organic layer may include an acrylate compound. The organic-inorganic complex layer may be a layer in which an inorganic material such as silicon oxide, zirconium oxide, aluminum oxide, tantalum oxide, niobium oxide, or glass beads is dispersed in an organic material such as an acrylate compound. In an exemplary embodiment of the present invention, the coating layer may include a metal oxide layer. The metal oxide layer may include metal oxides such as titanium, aluminum, molybdenum, tantalum, copper, indium, tin or tungsten, but exemplary embodiments of the present invention are not limited thereto.

The light transparent bonding member 110 may be disposed between the window 100 and the touch member 200. The window 100 and the touch member 200 may be bonded to each other by the light transparent bonding member 110.

The transmitter 700 transmitting a sensing signal may be disposed on the non-display area NPA of the circuit layer 500. The transmitter 700 may be electrically connected to the driving control circuit 502 via, for example, a contact pad 710.

The receiver 800 may be disposed on a lower surface of the substrate 600 of the display area PA. For example, the receiver 800 may be disposed on a sub substrate 810 fixed to the lower surface of the substrate 600 through a first adhesive layer 830 and a fixing member 820. As an example, the receiver 800 may be positioned at an opposite side of the substrate 600 from the light emitting layer 400. The receiver 800 may be spaced apart from the bottom surface of the substrate 600, thus forming an open space between the substrate 600 and the receiver 800.

In an exemplary embodiment of the present invention, the receiver 800 is not electrically connected to the circuit layer 500 and might not be controlled by the controller 80 (see, e.g., FIG. 1). The receiver 800 may be electrically connected to a circuit board 900. The receiver 800 may be fixed to the lower portion of the sub substrate 810 by a second adhesive layer 910.

As an example, the light emitting layer 400 may include an organic light emitting device. The receiver 800, the substrate 600, the circuit layer 500, the light emitting layer 400, and the encapsulation layer 300 will be described in more detail in more detail below.

Figure 5:
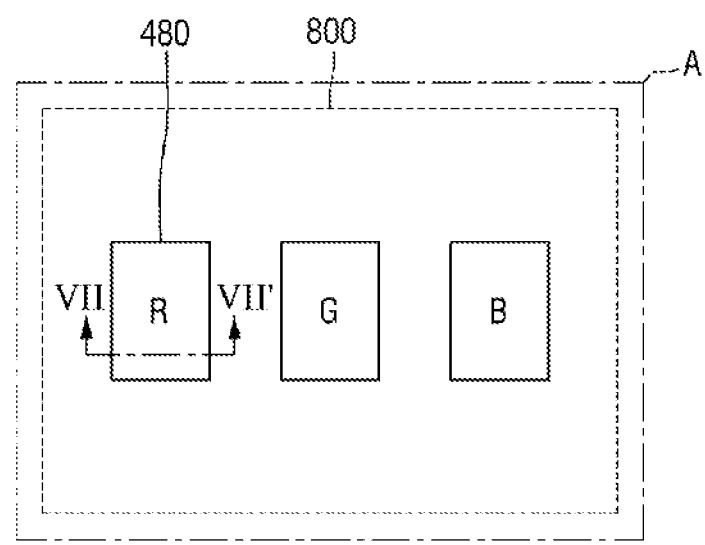
FIG. 5 is a view of a light emitting element and a receiver in a region A of FIG. 2.
Figure 6:
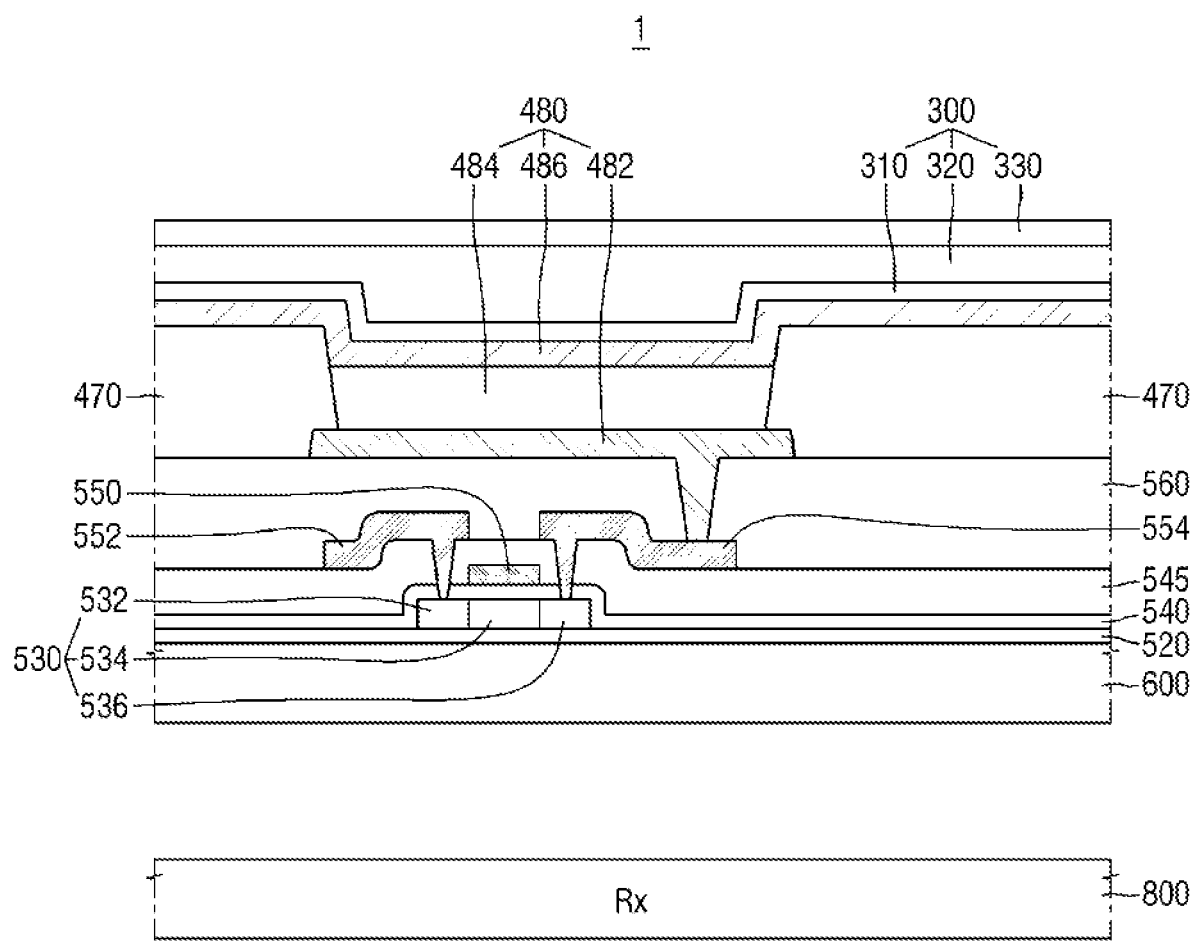
FIG. 6 is a cross-sectional view taken along line VII-VII' of FIG. 5.

FIG. 5 is a view of a light emitting element and a receiver in a region A of FIG. 2. FIG. 6 is a cross-sectional view taken along line VII-VII' of FIG. 5.

Referring to FIG. 5, the receiver 800 may be disposed on the lower surface of the substrate 600, and may have a cross-sectional area larger than that of one organic light emitting device 480. For example, the receiver 800 may be disposed to overlap a plurality of organic light emitting devices 480. Accordingly, the receiver 800 may receive the sensing signal through a region where the organic light emitting device 480 is not disposed. The receiver 800 and the organic light emitting device 480 will be described in more detail below Referring to FIG. 6, the circuit layer 500 (see, e.g., FIG. 4) disposed on the substrate 600 may include a buffer layer 520, a gate insulating layer 540, an interlayer insulating layer 545, and a planarization layer 560.

The buffer layer 520 may be disposed on the substrate 600. The buffer layer 520 may prevent impure elements from penetrating the substrate 600 may planarize a surface thereof. The buffer layer 520 may include one of, for example, a silicon nitride ($SiN_x$) layer, a silicon oxide ($SiO_2$) layer, or a silicon oxynitride ($SiO_xN_y$) layer. However, the buffer layer 520 may be. For example, the buffer layer 520 may be omitted according to a type of substrate 600 and device manufacturing process conditions.

The semiconductor layer 530 may be disposed on the buffer layer 520. The semiconductor layer 530 may include any one of a polycrystalline silicon layer (Poly Si), an amorphous silicon layer (Amorphous Si), or an oxide semiconductor such as indium-gallium-zinc oxide (IGZO) or indium zinc tin oxide (IZTO). For example, when the semiconductor layer 530 includes the polycrystalline silicon layer, the semiconductor layer 530 may include a channel region 534 in which impurities are not doped, and a source region 532 and a drain region 536 formed by doping impurities on both sides of the channel region.

The types of impurities doped into the source region 532 and the drain region 536 may vary depending on a type of the driving transistors included in the display device 1. In an exemplary embodiment of the present invention, a P-type transistor doped with P-type impurities may be used in the source region 532 and the drain region 536 as the driving transistors, but exemplary embodiments of the present invention are not limited thereto.

The gate insulating layer 540 may be disposed between the semiconductor layer 530 and the gate electrode 550. The gate insulating layer 540 may include an insulating layer. For example, the gate insulating layer 540 may include at least one of silicon nitride ($SiN_x$) or silicon oxide ($SiO_2$). In an exemplary embodiment of the present invention, the gate insulating layer 540 may include a multilayer structure including a double-layer layer or a single layer.

The gate electrode 550 may be disposed on the gate insulating layer 540. The gate electrode 550 may extend in a direction to be connected to a gate line. The gate electrode 550 may be disposed to overlap the channel region 534. The gate electrode 550 may include at least one of, for example, molybdenum (Mo), chrome (Cr), tungsten (W), titanium (Ti), or copper (Cu). In addition, a first electrode of a capacitor may be disposed on the gate insulating layer 540.

The interlayer insulating layer 545 may be disposed on the gate electrode 550. The interlayer insulating layer 545 may be disposed to completely cover the gate electrode 550. The interlayer insulating layer 545 may include silicon nitride ($SiN_x$), silicon oxide ($SiO_x$), or tetraethoxysilane (TEOS), but exemplary embodiments of the present invention are not limited thereto.

A data line including a source electrode 552 and a drain electrode 554 may be disposed on the interlayer insulating layer 545. A second electrode of the capacitor may be disposed on the interlayer insulating layer 545. The source electrode 552 and the drain electrode 554 may each include a multilayer layer of a double layer or more, and an interlayer insulating layer 545 may be disposed between the respective layers thereof.

The source electrode 552 and the drain electrode 554 may be connected to the source region 532 and the drain region 536 through via holes formed in the gate insulating layer 540 and the interlayer insulating layer 545, respectively. Vias may be formed in via holes so that the source electrode 552 and the drain electrode 554 may be connected to the source region 532 and the drain region 536, respectively.

The drain electrode 554 may be connected to a pixel electrode 482 of the organic light emitting device 480 through a via formed in the planarization layer 560.

According to an exemplary embodiment of the present invention, the pixel control circuit 501 may be disposed on the planarization layer 560. The interlayer insulating layer 545 may be disposed adjacent to the light emitting layer 400 on the planarization layer 560. The receiver 800 may be disposed in the insulating layer.

The driving transistors 530 and 550 may provide a driving signal to the pixel electrode 482 to emit a light providing layer 484 of the organic light emitting device 480 defining the pixel PX (see, e.g., FIG. 1).

For example, a voltage corresponding to a difference between a data voltage supplied from a data line and a common voltage supplied from a common power supply line may be stored in a capacitor, and a drive current corresponding to the voltage stored in the capacitor may run to the organic light emitting device 480 through driving transistors (e.g., 530 and 550) to emit light in the organic light emitting device 480. The semiconductor layer 530 and the gate electrode 550 may each operate as driving transistors, and may each be interchangeably referred to as driving transistors herein.

The planarization layer 560 may be disposed on the interlayer insulating layer 545 to cover the source electrode 552 and the drain electrode 554. The planarization layer 560 may remove and planarize a step to increase emission efficiency of the organic light emitting device 480 to be disposed thereon. The planarization layer 560 may include at least one material of, for example, a polyacrylates resin, an epoxy resin, a phenolic resin, a polyamides resin, a polyimides resin, an unsaturated polyesters resin, a polyphenylenethers resin, a polyphenylenesulfides resin, or benzocyclobutene (BCB).

The pixel control circuit 501 (see, e.g., FIG. 4) may include, for example, the driving transistors 530 and 550, the source electrode 552, the drain electrode 554.

The light emitting layer 400 (see, e.g., FIG. 4) disposed on the substrate 600 may include a pixel defining layer 470 and the organic light emitting device 480.

The pixel electrode 482 of the organic light emitting device 480 may be disposed on the planarization layer 560.

The pixel electrode 482 may be electrically connected to the drain electrode 554 through a via formed in the planarization layer 560.

The pixel defining layer 470 may be disposed to expose a part of the pixel electrode 482. The pixel defining layer 470 may define a pixel PX and the pixel electrode 482 may be disposed to correspond to a position of the pixel PX by the pixel defining layer 470.

The pixel defining layer 470 may include a resin such as polyacrylates or polyimides.

The light providing layer 484 may be disposed on the pixel electrode 482 and a common electrode 486 may be disposed on the pixel defining layer 470 and the light providing layer 484. The light providing layer 484 may include a relatively low molecular organic material or a relatively high molecular organic material. The light providing layer 484 may include a hole injection layer (HIL) and a hole transporting layer (HTL) disposed adjacent to the pixel electrode 482. The light providing layer 484 may include an electron transporting layer (ETL) and an electron injection layer (EIL) disposed adjacent to the common electrode 486.

In an exemplary embodiment of the present invention, the pixel electrode 482 may be a reflective electrode and the common electrode 486 may be a transmissive electrode or a transflective electrode. Accordingly, the light generated in the light providing layer 484 may be provided in a direction of the common electrode 486.

For example, transparent conductive oxide (TCO) may be used for forming a transmissive electrode. Examples of the transparent conductive oxide (TCO) may include indium tin oxide (ITO), fluorine doped tin oxide (FTO), indium zinc oxide (IZO), zinc oxide (ZnO), aluminum doped ZnO (AZO), gallium doped ZnO (GZO), boron-doped ZnO (BZO), or indium oxide ($In_2O_3$). In addition, metal nanowires and carbon nanomaterials may also be used (e.g., for forming a transmissive electrode). For example, silver nanowires (Ag—NW), carbon nanotubes, carbon nanowires, fullerene, or graphene may be used (e.g., for forming a transmissive electrode).

In addition, for forming the transflective electrode, a metal such as magnesium (Mg), silver (Ag), gold (Au), calcium (Ca), lithium (Li), chromium (Cr), aluminum (Al), or copper (Cu) or alloys thereof may be used. By controlling the thickness of the electrode, the common electrode 486 may be formed as the transflective electrode. As the thickness of the transflective electrode becomes thinner, the transmittance of light increases, but the resistance increases. In addition, the thicker the thickness, the lower the transmittance of light.

Further, the transflective electrode may include a multi-layer structure including a metal layer including a metal or a metal alloy and a transparent conductive oxide (TCO) layer laminated on the metal layer.

The encapsulation layer 300 (see, e.g., FIG. 4) disposed on the substrate 600 may include inorganic layers 310 and 330, and an organic layer 320. In an exemplary embodiment of the present invention, the encapsulation layer 300 may include the inorganic layers 310 and the organic layer 320 alternately laminated. As an example, the inorganic layers 310 and 330 and the organic layer 320 may be alternately and repeatedly laminated, such as to include a plurality of each of the inorganic layers 310 and 330 and the organic layer 320.

A lower inorganic layer 310 may be disposed nearest to the organic light emitting device 480. For example, the lower inorganic layer 310 may be in direct contact with the common electrode 486.

The lower inorganic layer 310 may include at least one of inorganic materials such as $Al_2O_3$, $TiO_2$, ZrO, $SiO_2$, AlON, AlN, SiON, $Si_3N_4$, ZnO, or $Ta_2O_5$. The lower inorganic layer 310 may be formed by a method such as chemical vapor deposition (CVD) or atomic layer deposition (ALD). Accordingly, the lower inorganic layer 310 may be conformally disposed according to the shape of the common electrode 486. An upper inorganic layer 330 may include a same material as the lower inorganic layer 310.

The organic layer 320 may include a polymer-based material. The polymer-based material may include an acrylic resin, an epoxy resin, polyimide, or polyethylene, for example. The organic layer 320 may be formed through a thermal deposition process. The thermal deposition process for forming the organic layer 320 may be performed within a temperature range without damage to the organic light emitting device 480.

The inorganic layers 310 and 330 in which the density of the thin layer is relatively densely formed may reduce or eliminate the permeation of moisture or oxygen.

A sensing operation of the display device 1 will be described in more detail below with reference to FIGS. 7 to 9.

Figure 7:
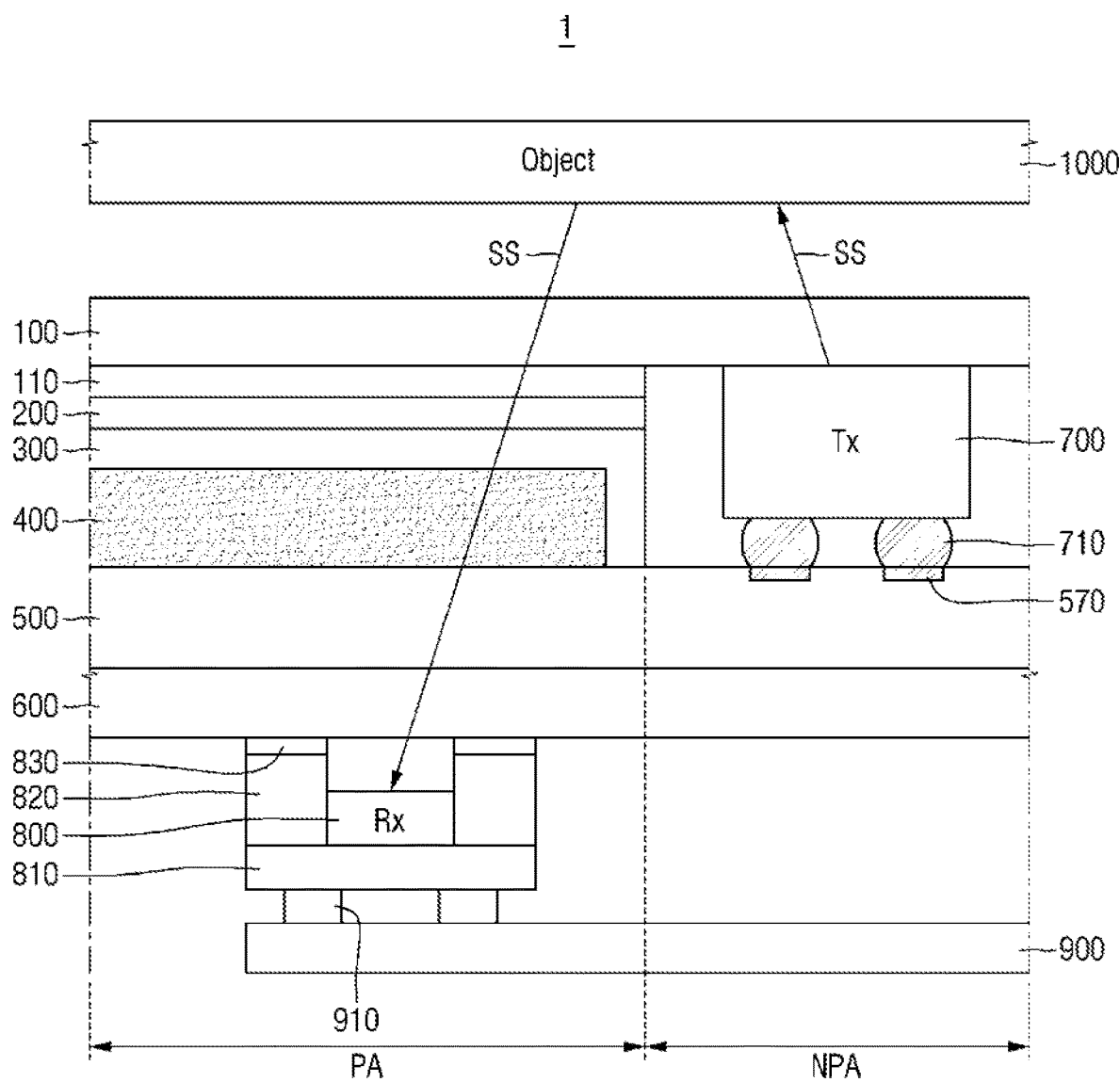
FIGS. 7 to 9 are views of operations of a display device according to an exemplary embodiment of the present invention.
Figure 8:
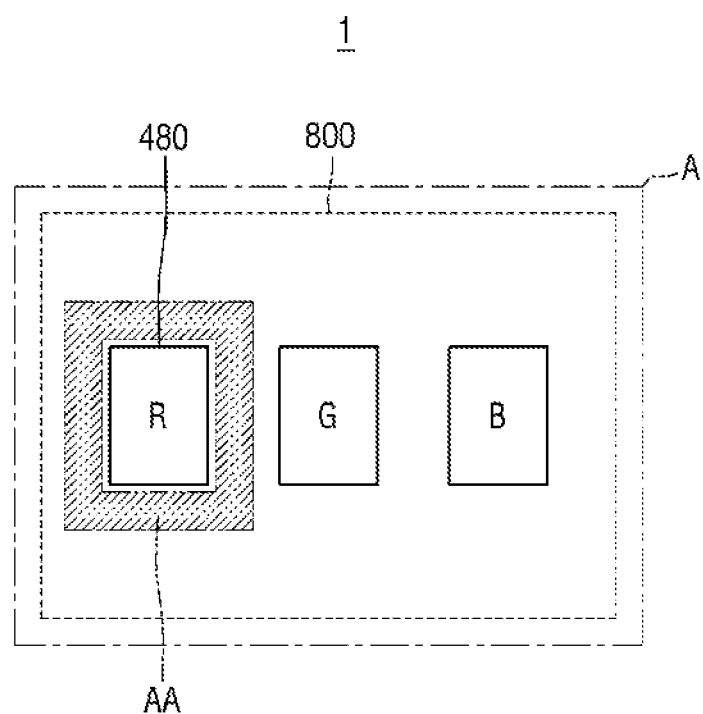
Figure 9:
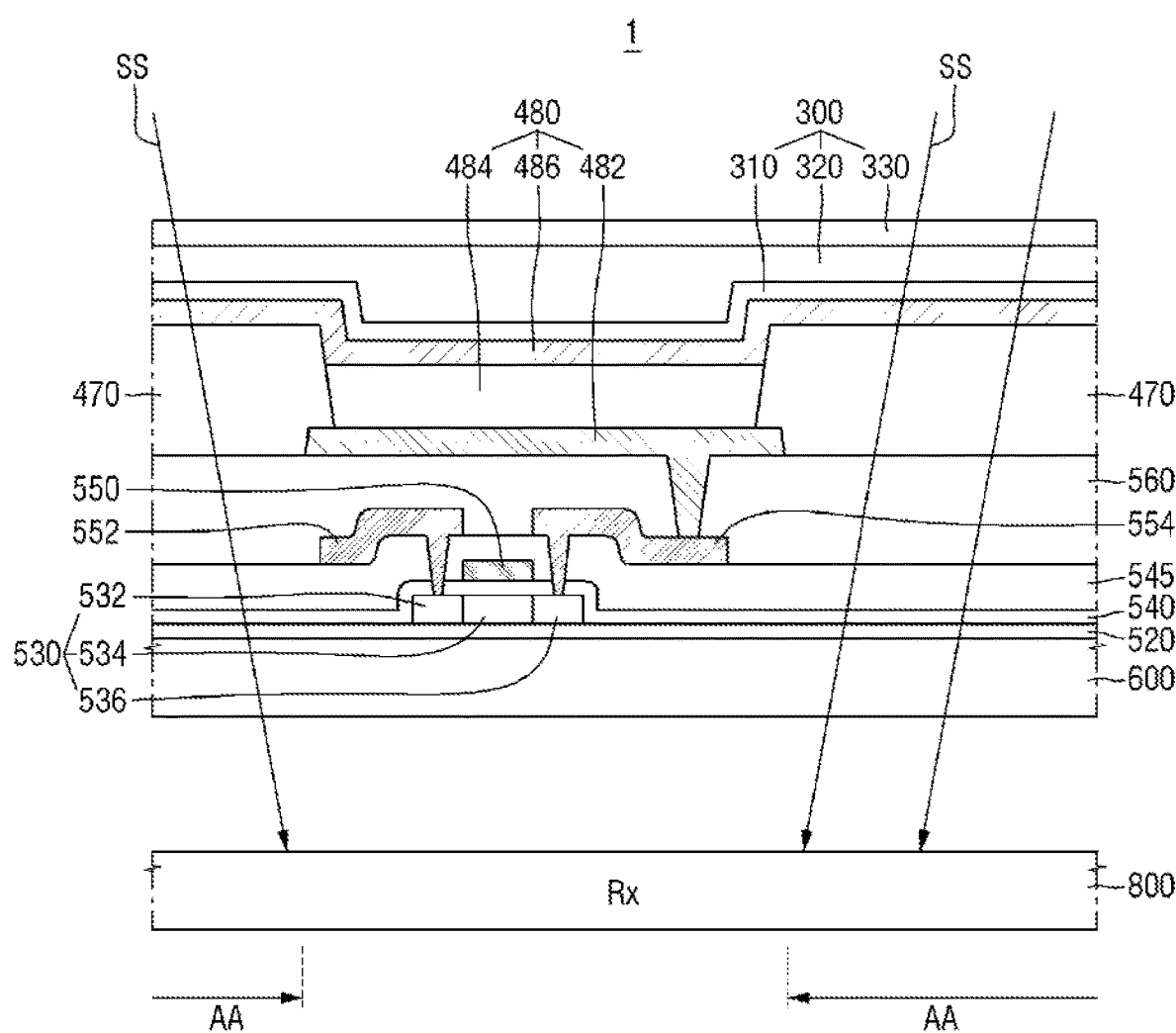

FIGS. 7 to 9 are views of operations of a display device according to an exemplary embodiment of the present invention.

Referring to FIG. 7, first, a sensing signal SS transmitted from the transmitter 700 may be reflected to a target object 1000 and may be incident to the display device. The sensing signal SS incident to the display device may be received by the receiver 800 disposed below the substrate 600 through the window 100, the touch member 200, the encapsulation layer 300, the light emitting layer 400, the circuit layer 500, and the substrate 600. In an exemplary embodiment of the present invention, since the window 100, the touch member 200, the encapsulation layer 300, the circuit layer 500, and the substrate 600 may each include a transparent material that transmits light, the sensing signal SS may be received by the receiver 800 by passing through the window 100, the touch member 200, the encapsulation layer 300, the circuit layer 500, and the substrate 600.

Referring to FIGS. 8 and 9, when the sensing signal SS passes through the light emitting layer 400, the sensing signal SS may be received to the receiver 800 by passing through a peripheral area AA of the light emitting element 480 defining the pixel PX. In the drawing, although only the R light emitting element 480 is illustrated as an example, the sensing signal SS may pass through the peripheral region AA of the B light emitting element 480 and/or the G light emitting element 480.

In an exemplary embodiment of the present invention, when only the transmitter 700 of the sensing element is disposed in the non-display area NPA of the display device 1, as compared with the case where both the transmitter 700 and the receiver 800 are arranged in the non-display area NPA, the size of the sensing element disposed in the non-display area NPA may be reduced. Therefore, it is possible to reduce an area in the non-display area NPA and to increase the size of the display area PA. Thus, a display device according to an exemplary embodiment of the present invention may include a relatively large display area PA and a relatively small non-display area NPA.

Figure 10:
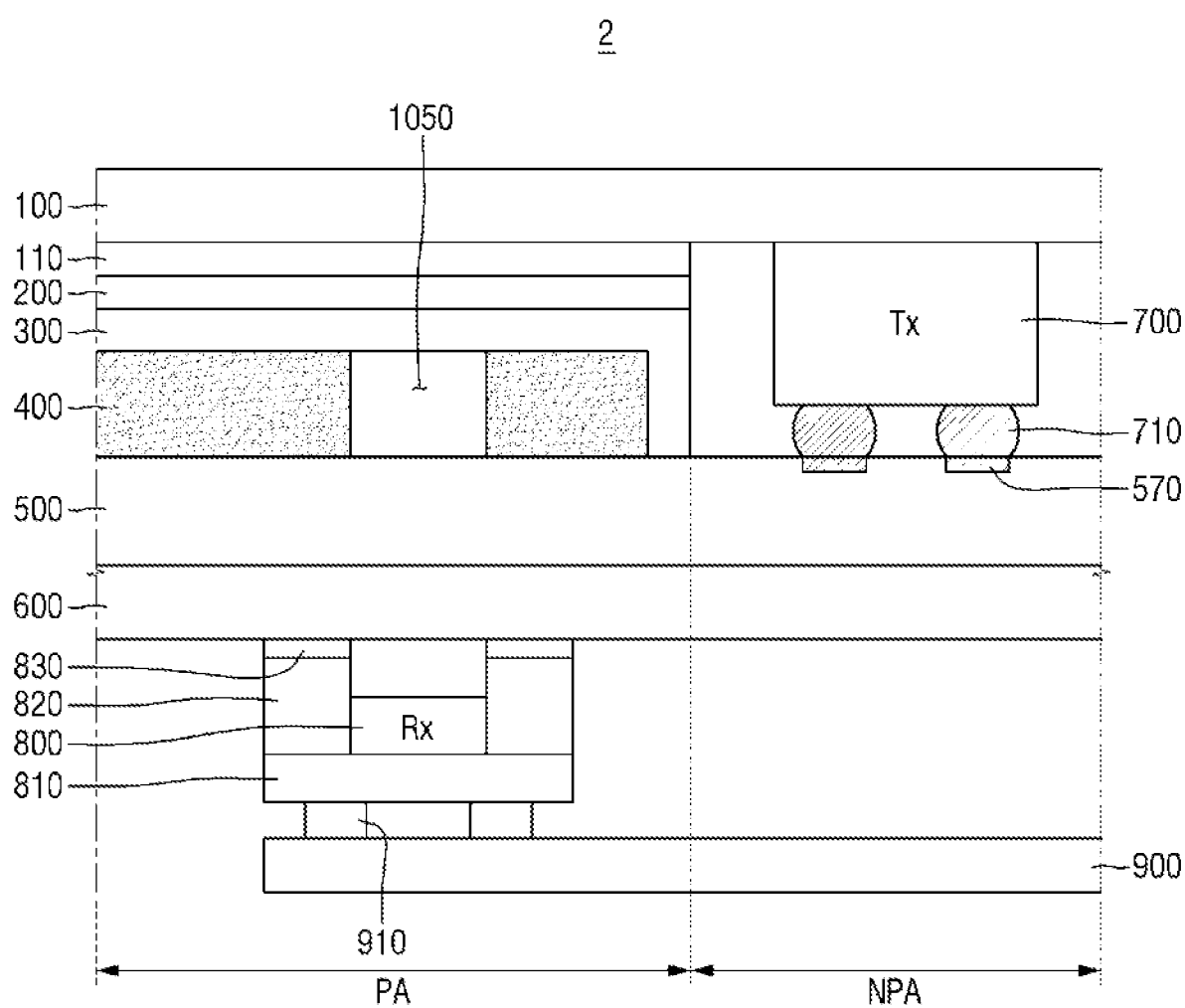
FIGS. 10 and 11 are views of a display device according to an exemplary embodiment of the present invention.
Figure 11:
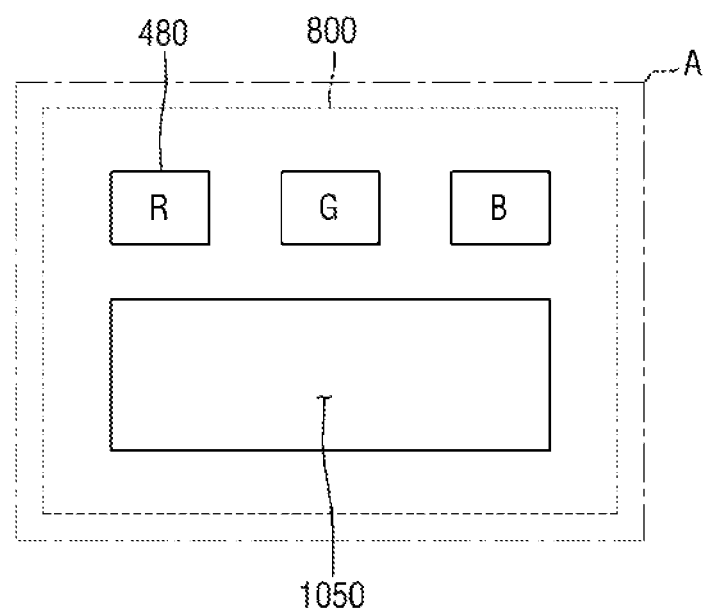

FIGS. 10 and 11 are views of a display device according to an exemplary embodiment of the present invention. Descriptions of components that are the same or substantially the same as those described above may be omitted below, and thus differences from the exemplary embodiments of the present invention described above may be focused on below.

Referring to FIGS. 10 and 11, a display device 2 may include a guide opening 1050 which vertically overlaps the receiver 800 inside the light emitting layer 400. Such a guide opening 1050 may be disposed in an adjacent region of the light emitting element 480.

In an exemplary embodiment of the present invention, the light emitting element 480 adjacent to the region in which the guide opening 1050 is disposed may be relatively small, but exemplary embodiments of the present invention are not limited thereto.

The guide opening 1050 may guide the sensing signal SS (see, e.g., FIG. 7) transmitted from the transmitter 700 to be received by the receiver 800. As described with reference to FIG. 8 above, the sensing signal SS (see, e.g., FIG. 7) can reach the receiver 800 by passing through the peripheral area AA of the light emitting element 480, but the transmittance may vary depending on the material characteristic of the light emitting layer 400. Accordingly, when such a guide opening 1050 is disposed in the light emitting layer 400, the operational reliability of the receiver 800 can be increased regardless of the material characteristics of the light emitting layer 400.

In an exemplary embodiment of the present invention, the guide openings 1050 may be disposed in a trench shape including an empty space. In this case, some of the components (for example, the pixel defining layer 470 described with reference to FIG. 6) of the light emitting layer 400 may define a side wall of the guide opening 1050. As an example, the guide opening 1050 may completely penetrate the light emitting layer 400.

In an exemplary embodiment of the present invention, the guide opening 1050 may be substantially filled with a transparent material. For example, the guide opening 1050 may be substantially filled with a transparent material that may better transmit the sensing signal SS (see FIG. 7) than the light emitting layer 400. Alternatively, the guide opening 1050 might not be filled with any material.

Descriptions of technical features described herein according to one exemplary embodiment of the present invention may be applicable to other exemplary embodiments of the present invention, and thus duplicative descriptions may be omitted herein. For example, the description of the technical features of the guide opening 1050 above may be similarly applicable a guide opening according to an exemplary embodiment of the present invention described below.

Figure 12:
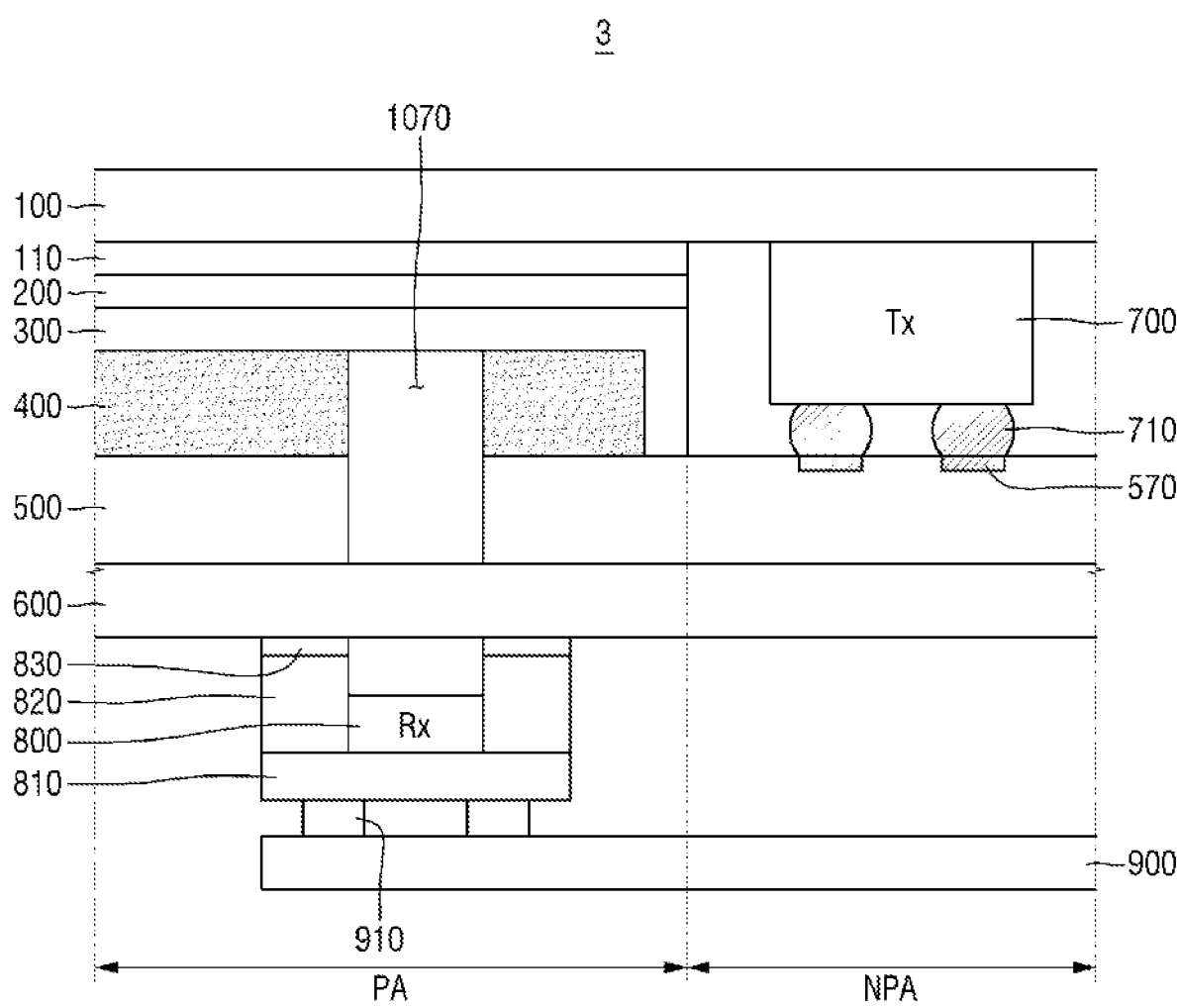
FIG. 12 is a view of a display device according to an exemplary embodiment of the present invention.

FIG. 12 is a view of a display device according to an exemplary embodiment of the present invention.

Referring to FIG. 12, a guide opening 1070 disposed inside the light emitting layer 400 of a display device 3 may extend to the circuit layer 500 by passing through the light emitting layer 400.

In an exemplary embodiment of the present invention, the guide opening 1070 may be substantially filled with a transparent material. For example, the guide opening 1070 may be substantially filled with a transparent material that may better transmit the sensing signal SS (see, e.g., FIG. 7) than the light emitting layer 400 and the circuit layer 500.

Figure 13:
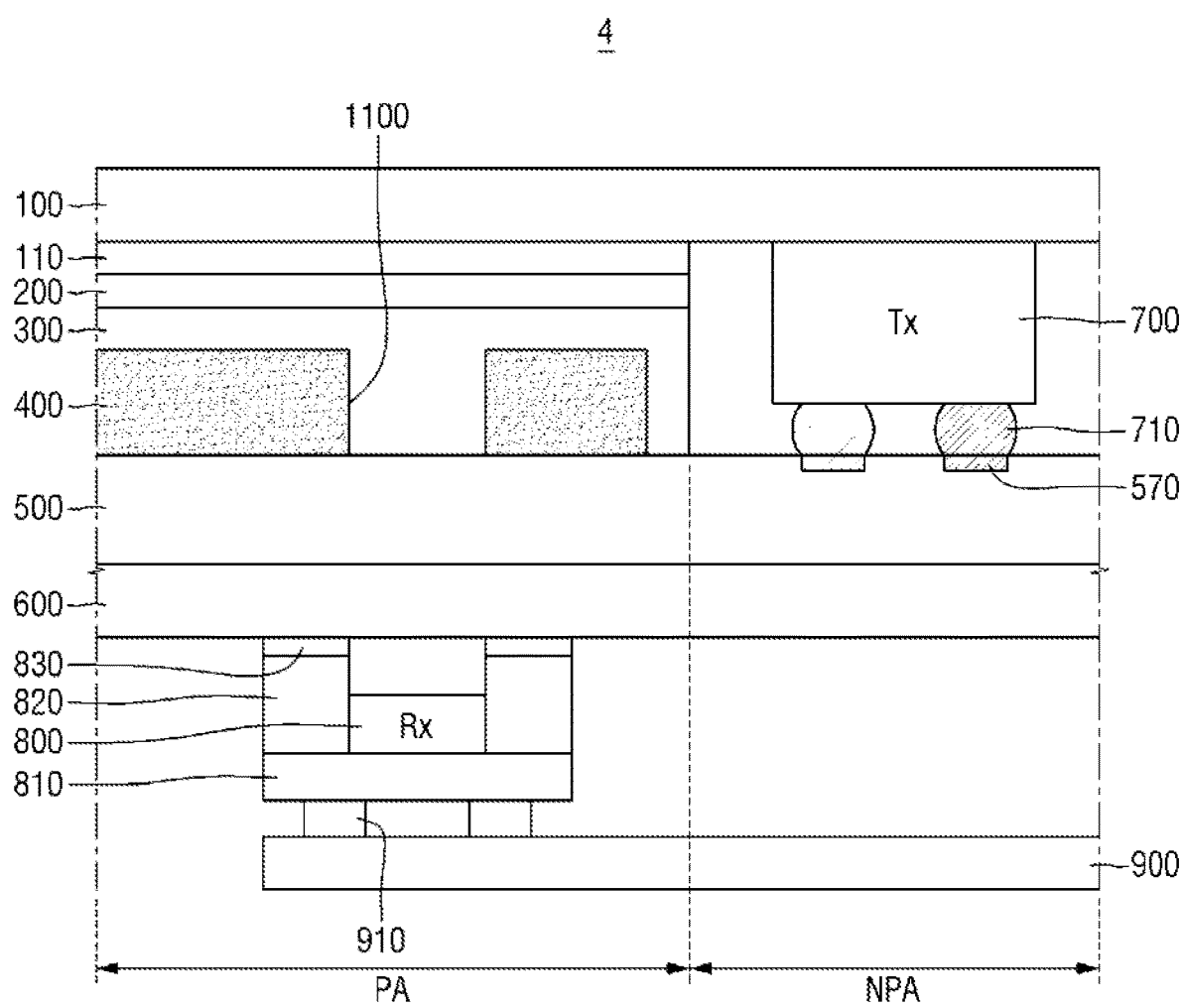
FIG. 13 is a view of a display device according to an exemplary embodiment of the present invention.

FIG. 13 is a view of a display device according to an exemplary embodiment of the present invention.

Referring to FIG. 13, a guide opening 1100 disposed inside the light emitting layer 400 of a display device 4 may be substantially filled with the encapsulation layer 300. The guide opening 1100 may be formed by forming a trench in the light emitting layer 400 and substantially filling the guide opening 1100 with the encapsulation layer 300 in the process of forming the encapsulation layer 300.

Figure 14:
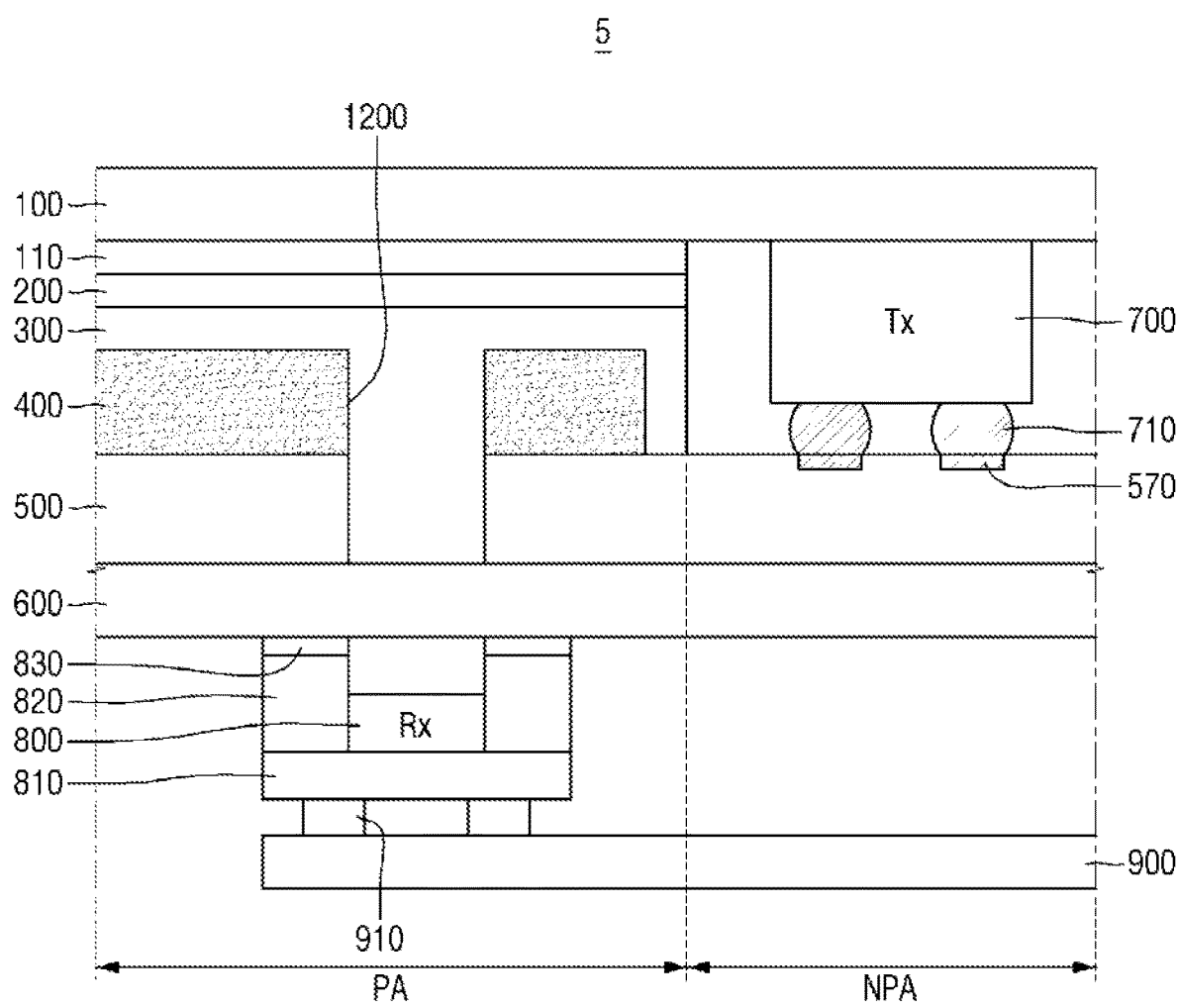
FIG. 14 is a view of a display device according to an exemplary embodiment of the present invention.

FIG. 14 is a view of a display device according to an exemplary embodiment of the present invention.

Referring to FIG. 14, a guide opening 1200 disposed inside the light emitting layer 400 and the circuit layer 500 of a display device 5 may be substantially filled with the encapsulation layer 300. The guide opening 1200 may be formed by forming a trench in the circuit layer 500 and light emitting layer 400 after forming the circuit layer 500 and the light emitting layer 400 and substantially filling the guide opening 1200 with the encapsulation layer 300 in the process of forming the encapsulation layer 300.

Figure 15:
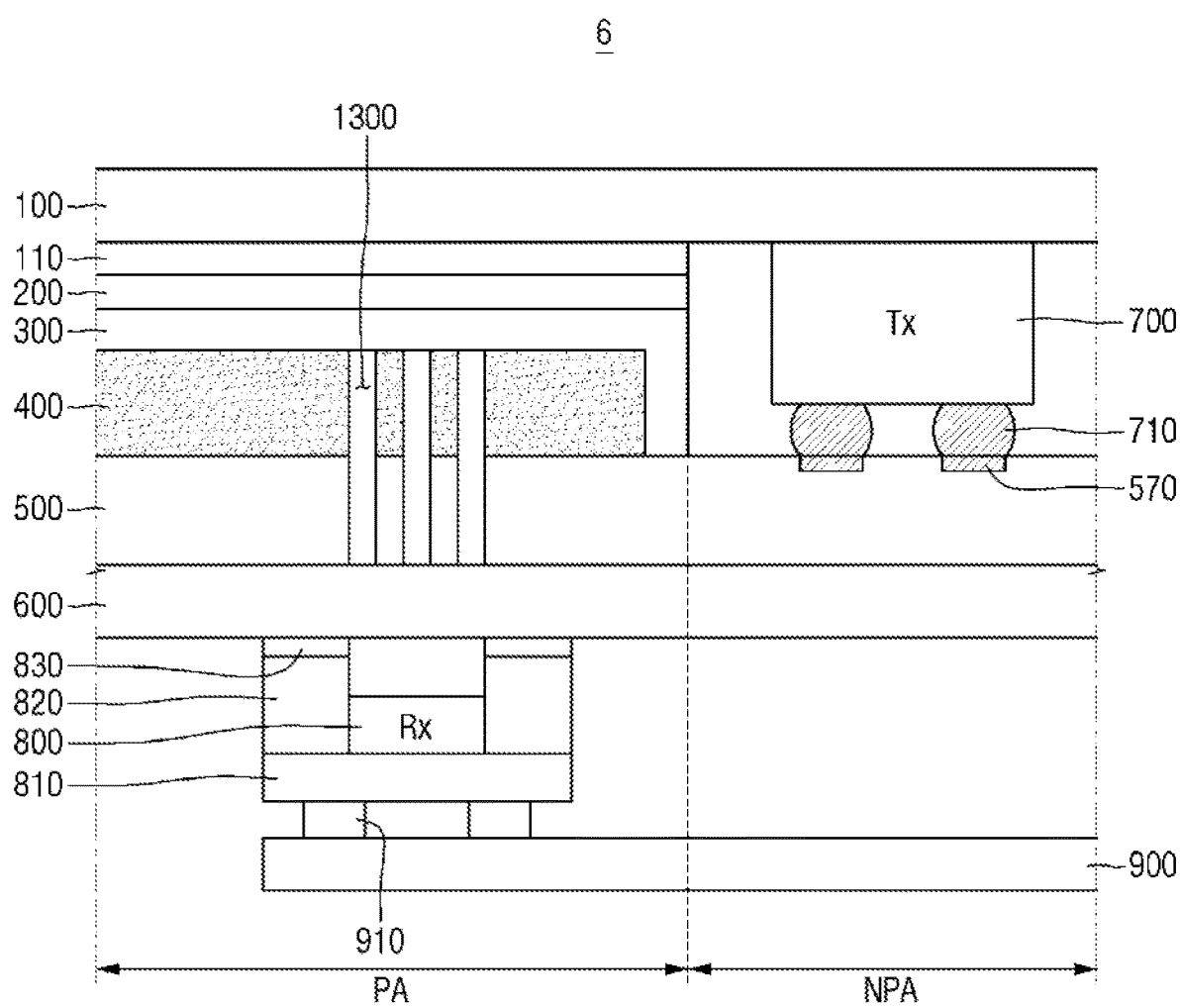
FIGS. 15 and 16 are views of a display device according to an exemplary embodiment of the present invention.
Figure 16:
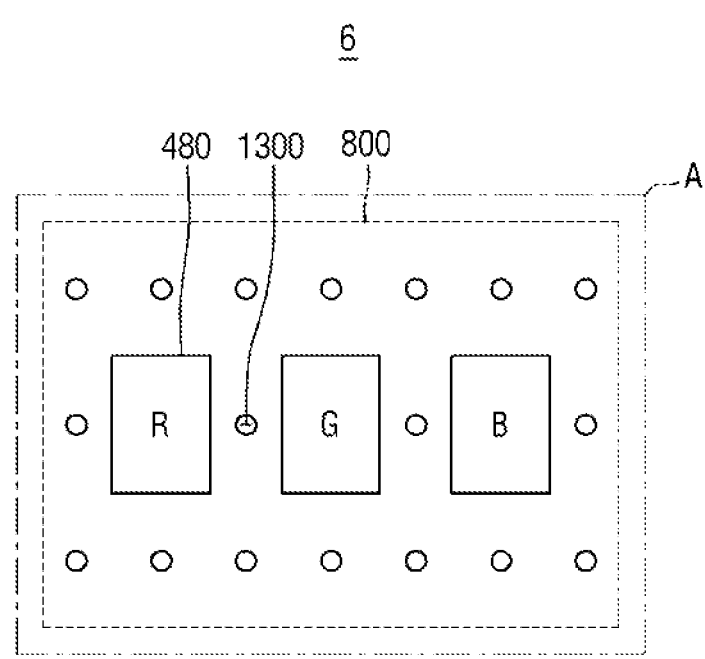

FIGS. 15 and 16 are views of a display device according to an exemplary embodiment of the present invention.

Referring to FIGS. 15 and 16, a guide openings 1300 disposed inside the light emitting layer 400 of a display device 6 may be disposed in at least one hole shape. The guide opening 1300 may be formed by removing adjacent areas of the light emitting element 480.

In an exemplary embodiment of the present invention, the guide openings 1300 may have a hole shape with an empty space therein. The guide opening 1300 may be formed by forming holes having a relatively small diameter in the light emitting layer 400 using a laser and covering the encapsulation layer 300 on the light emitting layer 400.

If the guide opening 1300 is formed in the hole shape and has a relatively small diameter, the encapsulation layer 300 might not be arranged to fill the guide opening 1300. Thus, the guide opening 1300 may be left as an empty space that is not filled by the encapsulation layer 300.

In an exemplary embodiment of the present invention, the guide opening 1300 may be substantially filled with a transparent material (e.g., a material other than the encapsulation layer 300). For example, the guide opening 1300 may be substantially filled with a transparent material that may better transmit the sensing signal SS (see, e.g., FIG. 7) than the light emitting layer 400. Alternatively, the guide opening 1300 may be filled with the encapsulation layer 300.

In an exemplary embodiment of the present invention, the guide opening 1300 may extend into the circuit layer 500. For example, the guide opening 1300 may completely penetrate the circuit layer 500.

Figure 17:
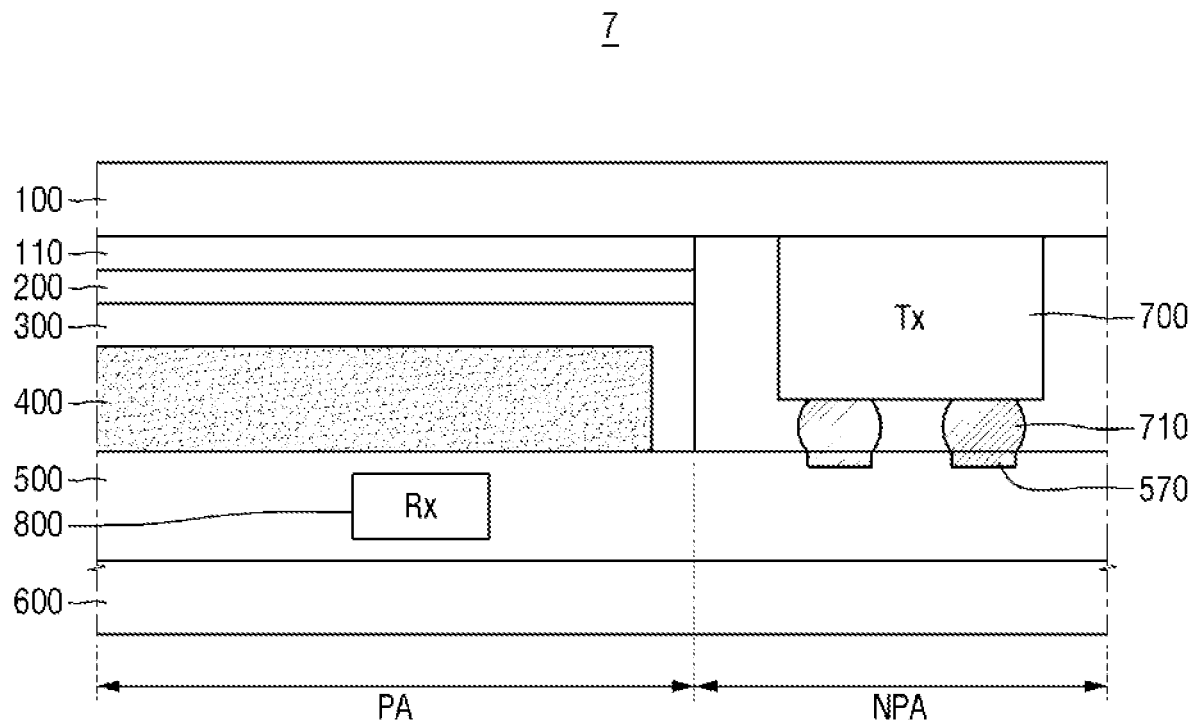
FIGS. 17 and 18 are views of a display device according to an exemplary embodiment of the present invention.
Figure 18:
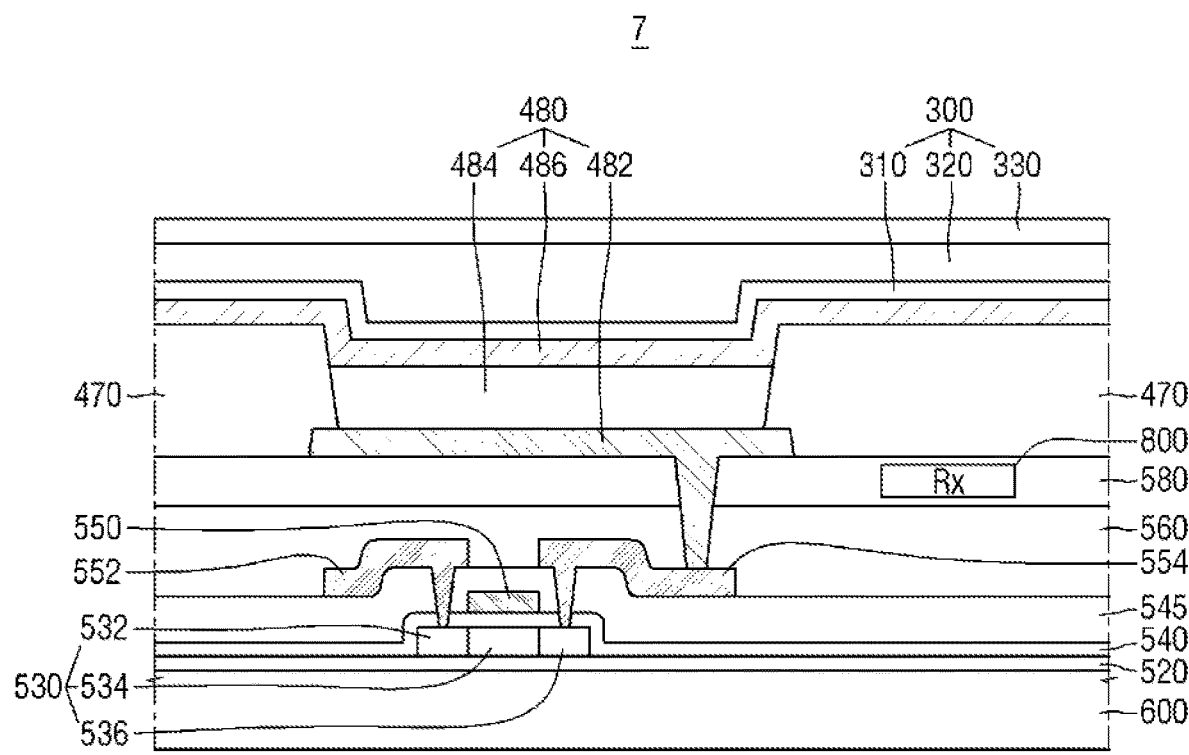

FIGS. 17 and 18 are views of a display device according to an exemplary embodiment of the present invention.

Referring to FIG. 17, the receiver 800 of a display device 7 may be disposed in the circuit layer 500. For example, in an exemplary embodiment of the present invention, the transmitter 700 may be disposed on the upper surface of the substrate 600, and the receiver 800 may be disposed on the lower surface of the substrate 600. However, in an exemplary embodiment of the present invention, the transmitter 700 and the receiver 800 may both be disposed on the upper surface of the substrate 600.

As an example, referring to FIG. 18, the circuit layer 500 of the display device 7 may further include an insulating layer 580 disposed on the planarization layer 560 and having the receiver 800 formed therein. The receiver 800 may be disposed in an area that does not overlap the pixel electrode 482 in a vertical direction with respect to an upper surface of the substrate 600.

In an exemplary embodiment of the present invention, the receiver 800 may be, for example, a photodiode sensing an infrared signal transmitted from an infrared transmitter.

In an exemplary embodiment of the present invention, the insulating layer 580 may include an organic layer, but exemplary embodiments of the present invention are not limited thereto. For example, the insulating layer 580 may include an inorganic layer.

According to an exemplary embodiment of the present invention, a display device may include a substrate (e.g., substrate 600) including a display area (e.g., display area PA) and a non-display area (e.g., non-display area NPA) adjacent to the display area. A plurality of pixels PX may be defined above the substrate. The circuit layer 500 may be disposed on the substrate. The light emitting layer 400 may be disposed on the circuit layer 500 in the display area. The transmitter 700 may be disposed on the circuit layer 500 in the non-display area. The transmitter 700 may be configured to transmit an infrared (IR) sensing signal to a target object (e.g., target object 1000 described with reference to FIG. 7). The receiver 800 may be disposed in the circuit layer 500. The receiver 800 may be configured to receive the IR sensing signal reflected by the target object.

According to an exemplary embodiment of the present invention, the circuit board 900 may be electrically connected to the receiver 800. The circuit board 900 may be configured to control an operation of the receiver 800 or may receive a signal from the receiver 800.

According to an exemplary embodiment of the present invention, the light emitting layer 400 may include a guide opening (e.g., guide opening 1400 described in more detail below with reference to FIG. 19) overlapping the receiver 800 and transmitting the IR sensing signal to the receiver 800 through the guide opening.

According to an exemplary embodiment of the present invention, the guide opening may include a plurality of holes penetrating the light emitting layer 400. Thus, the guide opening may completely penetrate the light emitting layer 400 to reach the receiver 800.

Figure 19:
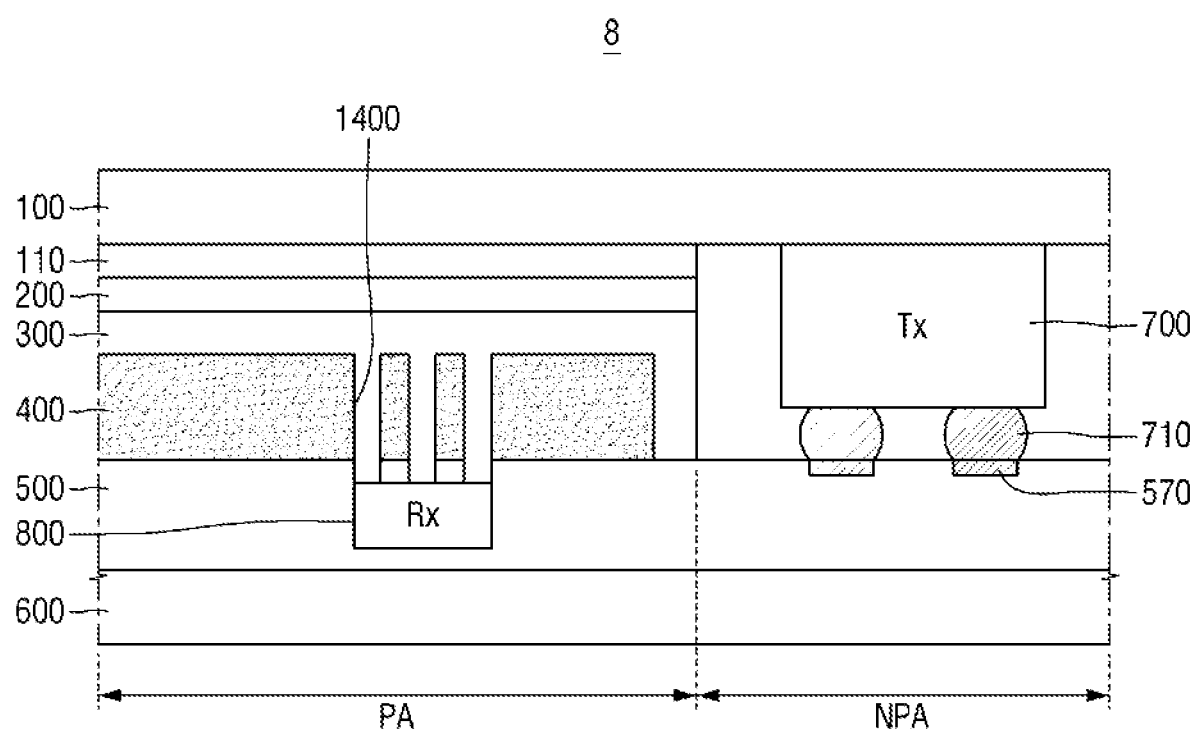
FIG. 19 is a view of a display device according to an exemplary embodiment of the present invention.

FIG. 19 is a view of a display device according to an exemplary embodiment of the present invention.

Referring to FIG. 19, the light emitting layer 400 of a display device 8 may include a guide opening 1400 that facilitates the transmission of a sensing signal to an area that vertically overlaps the receiver 800 disposed in the circuit layer 500.

As an example, the guide opening 1400 may be formed in a hole shape to extend from the light emitting layer 400 to the circuit layer 500; however, exemplary embodiments of the present invention are not limited thereto. For example, the shape of the guide opening 1400 may be modified by any of the above-described shapes of the guide openings.

The guide opening 1400 may be substantially filled with the encapsulation layer 300; however, exemplary embodiments of the present invention are not limited thereto. The guide opening 1400 may be substantially filled with a transparent material or may be left as an empty space.

As described above, according to an exemplary embodiment of the present invention, since only the transmitter of the sensing element is disposed in the non-display area, the size of the sensing element disposed in the non-display area may be smaller than that in the case where the transmitter and the receiver are disposed in the non-display area. Therefore, it is possible to reduce an area in the non-display area and relatively increase the size of the display area.

While the present invention has been shown and described with reference to the exemplary embodiments thereof, it will be apparent to those of ordinary skill in the art that various changes in form and detail may be made thereto without departing from the spirit and scope of the present invention.

What is claimed is:
1. A display device comprising:
  a substrate including a display area and a non-display area, the substrate including a first surface and a second surface opposite to the first surface;
  a light emitting layer disposed in the display area and disposed on the first surface of the substrate, the light emitting layer including a light emitting element; and
  a first sensing member disposed in the display area and receiving a sensing signal, the first sensing member disposed on the second surface of the substrate,
  wherein the light emitting layer includes a guide opening overlapping the first sensing member, and transmitting the sensing signal.
2. The display device of claim 1, further comprising:
  a circuit layer disposed in the display area and the non-display area, the circuit layer disposed between the first surface of the substrate and the light emitting layer,
  wherein the guide opening extends from the light emitting layer to the circuit layer.
3. The display device of claim 2, further comprising:
  a second sensing member disposed in the non-display area and transmitting the sensing signal.
4. The display device of claim 3,
  wherein the second sensing member is disposed on the circuit layer disposed in the non-display area, and
  wherein the second sensing member is electrically connected to a line of the circuit layer.
5. The display device of claim 1,
  wherein the guide opening includes a plurality of holes, and
  wherein at least two of the plurality of holes overlap the first sensing member.
6. The display device of claim 1,
  wherein the guide opening includes a plurality of holes, and
  wherein an occupied area of a hole of the plurality of holes is smaller than an occupied area of the first sensing member in a plan view.
7. The display device of claim 1,
  wherein the light emitting element overlaps the first sensing member.
8. The display device of claim 7,
  wherein the light emitting element does not overlap the guide opening.
9. The display device of claim 1,
  wherein the light emitting element is provided in a plural, and
  wherein a first light emitting element and a second light emitting element adjacent to the first light emitting element overlap the first sensing member.
10. The display device of claim 9,
  wherein the guide opening includes a plurality of holes, and
  wherein a hole of the plurality of holes is disposed between the first light emitting element and the second light emitting element in a plan view.
11. The display device of claim 1, further comprising:
  an encapsulation layer disposed on the light emitting layer, wherein the encapsulation layer overlaps the guide opening.

\* \* \* \* \*